(12) United States Patent
Pitonak et al.

(10) Patent No.: US 10,597,776 B2
(45) Date of Patent: Mar. 24, 2020

(54) PROCESS FOR COATING AN ARTICLE AND COATING PRODUCED THEREBY

(71) Applicant: BOEHLERIT GmbH & Co. KG., Kapfenberg (AT)

(72) Inventors: Reinhard Pitonak, Bruck/Mur (AT); Arno Koepf, Kapenfenberg (AT); Ronald Weissenbacher, Bruck/Mur (AT)

(73) Assignee: BOEHLERIT GMBH & CO. KG., Kapfenberg (AT)

( * ) Notice: Subject to any disclaimer, the term of this patent is extended or adjusted under 35 U.S.C. 154(b) by 193 days.

(21) Appl. No.: 15/543,781

(22) PCT Filed: Nov. 3, 2015

(86) PCT No.: PCT/AT2015/050277
§ 371 (c)(1),
(2) Date: Jul. 14, 2017

(87) PCT Pub. No.: WO2016/112417
PCT Pub. Date: Jul. 21, 2016

(65) Prior Publication Data
US 2018/0023194 A1    Jan. 25, 2018

(30) Foreign Application Priority Data
Jan. 15, 2015   (AT) .................................. 50025/2015

(51) Int. Cl.
*C23C 16/34*     (2006.01)
*C23C 16/455*    (2006.01)
(Continued)

(52) U.S. Cl.
CPC ...... *C23C 16/45523* (2013.01); *C23C 16/029* (2013.01); *C23C 16/0272* (2013.01);
(Continued)

(58) Field of Classification Search
USPC ..... 427/255.23, 0.26, 0.28, 0.32, 0.34, 0.36, 427/0.39, 0.391, 0.394; 428/216, 336,
(Continued)

(56) References Cited

U.S. PATENT DOCUMENTS 6,040,012 A *  3/2000  Anderbouhr ............ C23C 16/34
                                                  427/255.391
6,238,739 B1    3/2001  Venugopal et al.
(Continued)

FOREIGN PATENT DOCUMENTS

CN        101218370       7/2009
CN        101952480       1/2011
(Continued)

OTHER PUBLICATIONS

Pitonak et al "Novel TiAlN Coating by Medium Temperature Low Pressure CVD" Proc of the 18th Plansee Seminar, HM37 p. 1-12 (Year: 2013).*
(Continued)

*Primary Examiner* — Archene A Turner
(74) *Attorney, Agent, or Firm* — Greenblum & Bernstein, P.L.C.

(57) ABSTRACT

The invention relates to a process for coating an article (1), wherein a coating (2) having one or more coating layers (3, 4, 5) is applied to the article (1), wherein at least one coating layer (5) is formed essentially from aluminium, titanium and nitrogen, wherein the coating layer (5) has, at least in some regions, adjoining lamellae of different chemical composition and is deposited from a gas phase comprising at least one aluminium precursor and at least one titanium precursor. According to the invention, by setting a molar ratio of aluminium to titanium, the lamellae of different chemical composition are each formed with a cubic structure, it being possible for aluminium and titanium to be partly replaced by
(Continued)

Figure 4:
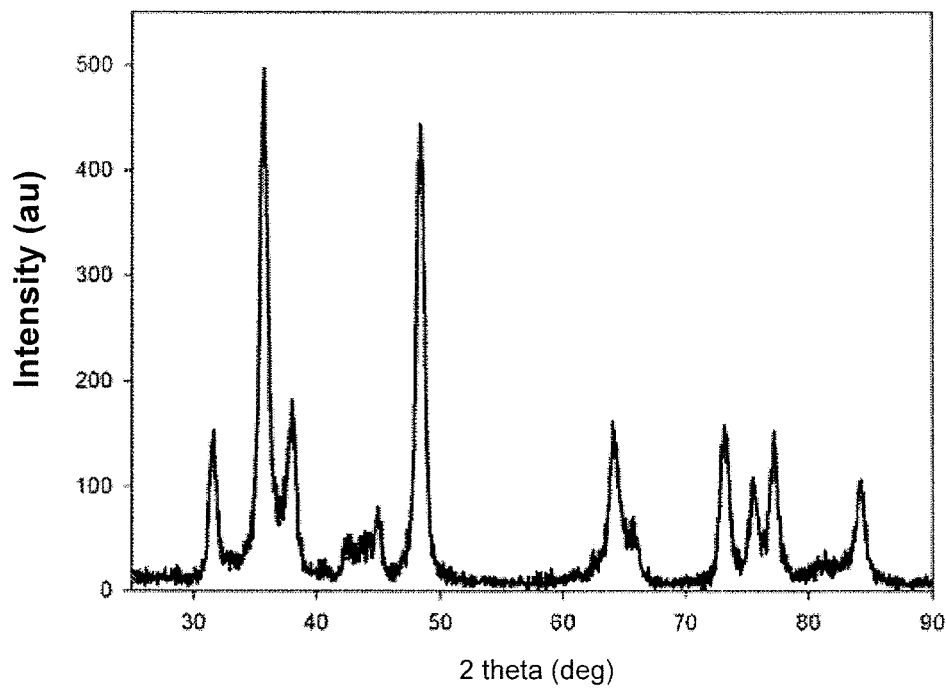

other metals and for nitrogen to be partly replaced by oxygen and/or carbon with retention of the cubic structure. The invention further relates to a correspondingly produced coating (2).

29 Claims, 3 Drawing Sheets

(51) Int. Cl.
    *C23C 28/04* (2006.01)
    *C23C 16/02* (2006.01)
    *C23C 30/00* (2006.01)

(52) U.S. Cl.
    CPC ............ *C23C 16/34* (2013.01); *C23C 28/044* (2013.01); *C23C 28/048* (2013.01); *C23C 30/005* (2013.01)

(58) Field of Classification Search
    USPC .................. 428/697, 698, 699; 51/307, 309
    See application file for complete search history.

(56) References Cited

U.S. PATENT DOCUMENTS

| | | | |
|---|---|---|---|
| 8,257,841 B2 | 9/2012 | Endler et al. | |
| 2008/0166588 A1* | 7/2008 | Astrand | C23C 14/0641 428/698 |
| 2008/0299366 A1 | 12/2008 | Ahlgren et al. | |
| 2009/0123779 A1 | 5/2009 | Endler | |
| 2009/0165597 A1* | 7/2009 | Haidar | B22F 9/28 75/620 |
| 2011/0003126 A1 | 1/2011 | Van Den et al. | |
| 2012/0219789 A1* | 8/2012 | Endler | C23C 16/34 427/255.394 |
| 2013/0149527 A1* | 6/2013 | Cho | C23C 16/34 427/255.34 |
| 2015/0064452 A1* | 3/2015 | Pitonak | C23C 16/34 428/336 |
| 2015/0345013 A1* | 12/2015 | Paseuth | C23C 16/34 427/255.394 |

FOREIGN PATENT DOCUMENTS

| | | | |
|---|---|---|---|
| CN | 101970716 | | 2/2011 |
| CN | 102686772 | | 9/2012 |
| CN | 103429785 | | 12/2013 |
| CN | 104169460 | | 11/2014 |
| DE | 10 2005 032 860 | | 1/2007 |
| DE | 10 2007 000 512 | | 1/2009 |
| DE | 10 2008 013 964 | | 9/2009 |
| DE | 10 2008 013 966 | | 9/2009 |
| EP | 0709483 | | 5/1996 |
| EP | 1795628 | | 6/2007 |
| EP | 2008743 | | 12/2008 |
| WO | 03/085152 | | 10/2003 |
| WO | 2006/023222 | | 3/2006 |
| WO | 2009/112117 | | 9/2009 |
| WO | 2012/126030 | * | 9/2012 |
| WO | 2013/134796 | | 9/2013 |
| WO | 2014/103533 | * | 7/2014 |

OTHER PUBLICATIONS

Endler et al., "Proceedings Euro PM 2006", Ghent, Belgium, vol. 1, Oct. 23-25, 2006, pp. 219.
China Office Action/Search Report conducted in counterpart China Appln. No. 201580073689.3 (dated Jul. 18, 2018) (w/ translation).
Austria Search Report conducted in Austria Appln. No. A 50025/2015 (dated Jun. 12, 2015).
Japan Notif. of Reasons for Refusal conducted in counterpart Japan Appln. No. 2017-506997 (dated Apr. 18, 2019) (w/ translation).

* cited by examiner

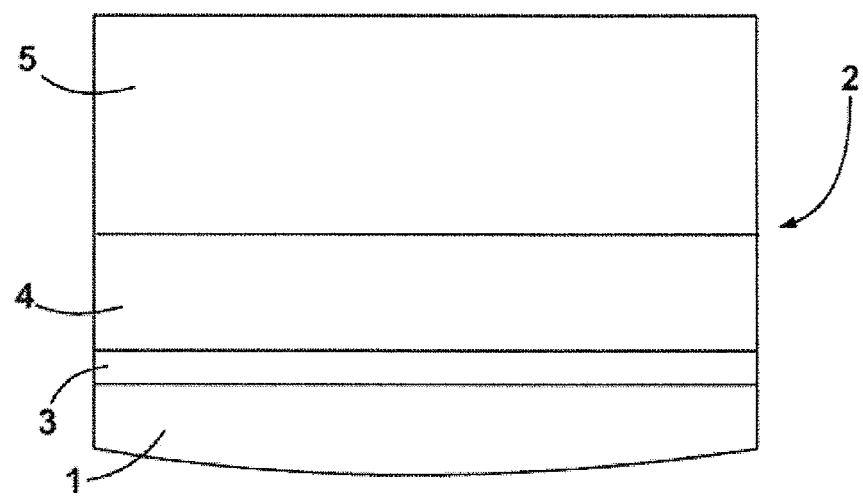
Fig. 1
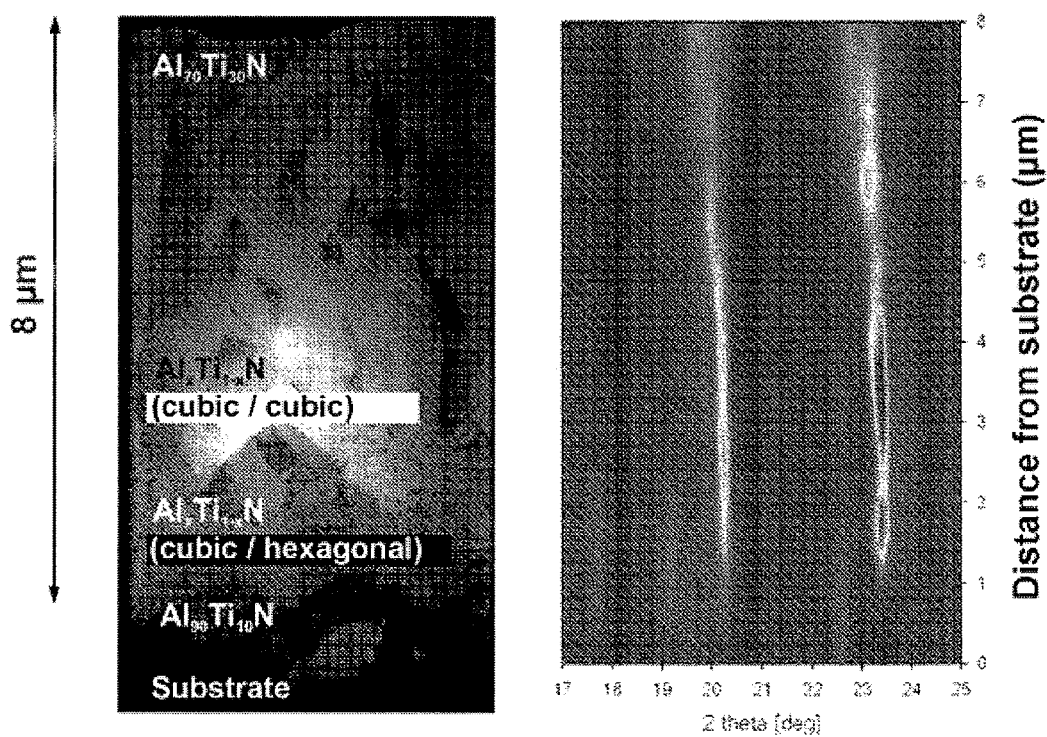
Fig. 2   Fig. 3

TiAlN 111      TiAlN 200      Al$_2$O$_3$ 112

PROCESS FOR COATING AN ARTICLE AND COATING PRODUCED THEREBY

The invention relates to a method for coating an object, wherein a coating having one or more coating layers is applied to the object, wherein at least one coating layer is formed essentially from aluminum, titanium and nitrogen, wherein the coating layer comprises, at least in some regions, mutually adjoining lamellae of varying chemical composition and is deposited from a gas phase having at least one aluminum precursor and at least one titanium precursor.

Furthermore, the invention relates to a coating which is applied to an object by means of chemical vapor deposition (CVD), wherein the coating comprises one or more coating layers, and wherein at least one coating layer is formed essentially from aluminum, titanium and nitrogen and comprises, at least in some regions, mutually adjoining lamellae of varying chemical composition.

From the prior art, it is known that cutting tools or cutting inserts are coated with coating layers that are composed of titanium, aluminum and nitrogen in order to increase a service life in the cutting application. In this regard, reference is often generally made to TiAlN coating layers, wherein an average chemical composition is specified by $Ti_{1-x}Al_xN$, regardless of whether one or more phases are present in the coating layer. For coating layers which contain more aluminum than titanium, the nomenclature AlTiN, or more precisely $Al_xTi_{1-x}N$, is common.

From WO 03/085152 A2, the production of monophasic coating layers with a cubic structure in the AlTiN system is known, wherein at a relative content of aluminum nitride (AlN) of up to 67 mole percent (mol %), a cubic structure of the AlTiN is obtained. At higher AlN contents of up to 75 mol % a mixture of cubic AlTiN and hexagonal AlN is produced, and at an AlN content of more than 75 mol % exclusively hexagonal AlN and cubic titanium nitride (TiN) are produced. According to the document cited, the described AlTiN coating layers are deposited by means of physical vapor deposition (PVD). With a PVD method, maximum relative contents of AlN are thus virtually limited to 67 mol %, since otherwise instabilities are possible in phases that only contain aluminum in the form of hexagonal AlN. However, a higher relative content of cubic AlN is, according to expert opinion, desirable in order to maximize a wear resistance to the greatest possible extent.

From the prior art, the use of chemical vapor deposition (CVD) in place of PVD methods is also known, wherein a CVD method is to be carried out at relatively low temperatures within the temperature window of 700° C. to 900° C., since cubic AlTiN coating layers cannot be produced at temperatures of ≥1000° C., for example, due to the metastable structure of this type of coating layers. If necessary, the temperatures can also be even lower according to U.S. Pat. No. 6,238,739 B1, namely within the temperature window from 550° C. to 650° C., wherein high chlorine contents in the coating layer are to be expected, however, which proves disadvantageous for an application case. Attempts have therefore been made to optimize CVD methods such that AlTiN coating layers with a high content of aluminum and a cubic structure of the coating layer can be produced with said methods (I. Endler et al., Proceedings Euro PM 2006, Ghent, Belgium, 23 to 25 Oct. 2006, Vol. 1, 219). Even though these coating layers have a high microhardness, and therefore fundamentally advantageous properties for a high wear resistance during use, it has been shown that an adhesive strength of coating layers of this type can be too low. In light of this, it is therefore proposed in DE 10 2007 000 512 B3 that a Hm thick coating layer that is formed as a phase gradient layer and composed of a phase mix of hexagonal AlN, TiN and cubic AlTiN be provided beneath a cubic AlTiN coating layer that is 3 μm thick, wherein a cubic AlTiN content has an increasing proportion with outwards or towards the (exclusively) cubic AlTiN coating layer. Cutting plates coated in such a manner were used to mill steel, wherein however only slight improvements in a wear resistance were achieved compared to coating layers that were produced by means of a PVD method.

In addition to the merely slight improvement in a wear resistance, a further disadvantage of a bonding layer according to DE 10 2007 000 512 B3 is that the bonding or phase gradient layer grows extremely quickly, even in experiments on a laboratory scale (I. Endler et al., Proceedings Euro PM 2006, Ghent, Belgium, 23 to 25 Oct. 2006, Vol. 1, 219). In the case of production in a larger reactor that is designed for an industrial coating of cutting plates, this leads to the bonding or phase gradient layer becoming extremely thick in the provided coating process, since a temperature for forming the ultimately envisioned cubic AlTiN coating layer must be reduced, which requires adequate time. During this reduction of process temperature, however, a thickness of the bonding or phase gradient layer increases rapidly, since a fast cooling is not possible in an industrial reactor. It would be conceivable to interrupt the coating process for a longer period or to interrupt the cooling, but this is not cost-efficient.

From WO 2013/134796 A1, a coated body and a method for coating a body have become known, wherein a special coating layer of $AlTi_{1-x}N$ is formed with a lamellar structure in individual regions. This lamellar structure is composed of alternating lamellae of $Ti_{1-x}Al_xN$ (mostly Ti as metal) and, alternating therewith, $Al_xTi_{1-x}N$ (mostly Al as metal). The $Ti_{1-x}Al_xN$ is present as a cubic phase, whereas the $Al_xTi_{1-x}N$ has a hexagonal structure. Even though hexagonal AlN or $Al_xTi_{1-x}N$ is not desired per se according to the explanations above, the hexagonal AlN or in the alternating embodiment with cubic TiN or $Ti_{1-x}Al_xN$ has proven advantageous in this special structure, which is due to the formation of the lamellae on the nanometer scale.

Although an $Al_xTi_{1-x}N$ coating layer according to WO 2013/134796 A1 already exhibits excellent properties, it would preferable to be able to provide even better coating layers in terms of a hardness. This is the object addressed by the invention, which aims to specify a method of the type named at the outset with which coatings can be produced with a corresponding coating layer.

A further object of the invention is to specify a coating of the type named at the outset which comprises an $Al_xTi_{1-x}N$ coating layer having a high hardness.

The method-related object is attained if, in a method of the type named at the outset, the lamellae of varying chemical composition are each formed with a cubic structure by adjustment of a molar ratio of aluminum to titanium, wherein with the retention of the crystal system, aluminum and titanium can be partially replaced by other metals, and nitrogen can be partially replaced by oxygen and/or carbon.

One advantage achieved with the method according to the invention can be seen in that, by means of the adjustment of a molar ratio of aluminum to titanium via a corresponding introduction of at least one aluminum precursor and at least one titanium precursor, the crystal systems in the lamellae can be adjusted in a targeted manner in the direction of a cubic structure or phase. If, in comparison with the prior art, the titanium content is kept relatively high, lamellae form which comprise $Ti_{1-x}Al_xN$ and cubic $Al_xTi_{1-x}N$ in an alternating manner. In one of the alternating lamellae, a composition approaching TiN is present; in the other, a composition approaching AlN is present. If the formation of the two lamellae is cubic, the proportionally higher introduction of a titanium precursor can lead to the cubic $Ti_{1-x}Al_xN$ lamellae imposing the cubic structure on the adjacent $Al_xTi_{1-x}N$ lamellae, even though a hexagonal phase would be expected in principle.

It is advantageous that a respectively cubic structure of the alternating lamellae results in an excellent hardness of a corresponding coating layer. In addition, however, it has also been shown that, despite a reduced aluminum content in comparison with the prior art, an excellent oxidation resistance is provided. In principle, with a reduced aluminum content, a poorer oxidation resistance would be expected, but this could not be observed in lamellae systems with cubic lamellae of varying chemical composition. Clearly, the set sequence of lamellae not only leads to a higher hardness because of the higher titanium content, but also leads to a high oxidation resistance.

As long as the crystal system is retained, aluminum and titanium can be partially replaced by other metals. In particular, silicon can be used therefor. The contents of the substitute metals such as silicon can, for example, be limited to 20%, preferably 10%, in particular 7.5%, in order to keep from excessively disturbing the original formation of the lamellae. On the other hand, the use of substitute metals such as chromium at low contents results in the possibility of fine-tuning the properties of the coating layer to the use requirements in a targeted manner.

It is likewise possible that nitrogen is partially replaced by oxygen and/or carbon, once again under the condition that the crystal system is retained. For example, a small substitution of nitrogen with oxygen can be advantageous for certain machining applications. It is once again necessary that the crystal system set in the lamellae be retained through the partial replacement of nitrogen with oxygen and/or carbon, whereby upper threshold values for a possible replacement of the nitrogen result.

Particularly for the formation of lamellae with a cubic structure at least in individual regions of a coating layer, it is expedient that, for the deposition of the at least one coating layer of essentially aluminum, titanium and nitrogen, a molar Al/Ti ratio in the gas phase is, at least temporarily, limited to maximally 3.0, preferably maximally 2.0, in particular maximally 1.5. At a higher molar content of the titanium, the formation of cubic $Ti_{1-x}Al_xN$ lamellae (with a higher Ti content than Al content) is facilitated, which lamellae grow in an alternating manner with $Al_xTi_{1-x}N$ lamellae (with a higher Al content than Ti content), wherein the first type of lamellae is formed cubically and imposes this cubic structure or the crystal system on the second type of lamellae.

The thickness of the lamellae can also be modified by adjustment of a molar ratio of aluminum to titanium. It is preferred that the lamellae are deposited with a lamellar periodicity of less than 20 nm, preferably 3 nm to 17 nm, in particular 5 nm to 15 nm. Particularly within the range from approximately 8 nm to 13 nm, there result excellent coating layers having lamellae which, at least in some regions of the coating layer, are exclusively cubically formed.

It is preferred that the at least one coating layer of essentially aluminum, titanium and nitrogen is deposited with an average composition of $Al_xTi_{1-x}N$ and from a gas phase comprising aluminum trichloride, titanium tetrachloride and ammonia. Of course, carrier gases such as nitrogen and/or hydrogen can also be used. Although in principle it is possible to work with respectively one precursor for aluminum and one precursor for titanium, it is understood that, if necessary, multiple precursors for the individual metals can also be used. It is also possible to admix additional precursors, in particular if aluminum and/or titanium are to be substituted slightly by other metals, in order to finely adjust the properties of the coating layer. For example, chromium compounds and/or silicon compounds can be admixed to the reactive gas in order to incorporate chromium or silicon into the coating layer, respectively. For example, up to 5% chromium and/or 5% silicon can be provided to replace aluminum and/or titanium.

It is also preferable, that the at least one coating layer of essentially aluminum, titanium and nitrogen is deposited with an average composition of $Al_xTi_{1-x}N$ with $0.70 \leq x \leq 0.90$, preferably $0.75 \leq x \leq 0.85$. Compared to the prior art, according to which the object consisted in the production of cubic structures of the general formula $Al_xT_{1-x}N$ with the highest possible aluminum contents in order to maximize an oxidation resistance, a somewhat lower relative content of aluminum can, according to the invention, deliberately be provided in the coating layer, without disadvantageously reducing an oxidation resistance.

The at least one coating layer of essentially aluminum, titanium and nitrogen is deposited in a CVD method, wherein a pressure of 10 mbar to 80 mbar, in particular 20 mbar to 50 mbar, can be set. The setting of the pressure occurs by a corresponding introduction of the reactive gases or precursors with carrier gases.

For the deposition in a CVD method, a temperature control is selected such that the at least one coating layer of essentially aluminum, titanium and nitrogen is deposited at a temperature of approximately 750° C. to 850° C. Within this temperature window, the desired formation of the lamellae with a cubic structure can be set without difficulty by varying the molar fractions of aluminum and titanium in the reactive gas.

The at least one coating layer of essentially aluminum, titanium and nitrogen is normally deposited with a thickness of 1 μm to 20 μm, in particular 3 μm to 8 μm.

If the at least one coating layer of essentially aluminum, titanium and nitrogen is deposited on a suitable substrate such as sapphire, an epitaxial deposition can occur.

Even though any desired objects can be coated according to a method disclosed by the invention. said method is preferably used when coating an object made from a hard metal, in particular a cutting insert such as an indexed cutting plate.

In a method according to the invention, a coating layer of essentially aluminum, titanium and nitrogen can be the only coating layer applied to the object. Particularly for a coating of cutting inserts such as cutting plates or blades, however, it is expedient to deposit a multi-layer coating. As a first coating layer, a bonding layer of TiN, preferably with a thickness of less than 0.1 μm, can be deposited.

It can prove advantageous that the at least one coating layer of essentially aluminum, titanium and nitrogen is deposited on a coating layer of TiCN. The coating layer of TiCN is preferably a medium temperature TiCN (MT-TiCN) coating layer as is known from the prior art. A TiCN coating layer of this type comprises a spiky structure which extends perpendicularly away from the surface of the substrate. On a coating layer of this type, a coating layer of essentially aluminum, titanium and nitrogen having lamellae of varying chemical composition but each having a cubic structure can be deposited excellently and with high adhesive strength, which is optimal for application purposes.

A method according to the invention can be managed particularly efficiently if, in the deposition of a first coating layer and subsequent deposition of each additional coating layer, a deposition temperature is respectively lowered or maintained. A substrate or object on which a coating is created can thus first be brought to a specific desired temperature, after which the deposition of the coating having multiple coating layers is started. Since no further heating is necessary after the deposition of the first coating layer, the application of a coating having multiple coating layers can take place relatively quickly, and therefore cost-efficiently. Particularly if a bonding layer of TiN, then an MT-TiCN coating layer and finally a coating layer of essentially aluminum, titanium and nitrogen having a lamellar structure within said coating layer are provided, all coating layers can be deposited within the temperature window from 750° C. to 900° C. Since the temperature window for the deposition of all coating layers is already relatively narrow, and because there is thus only a short period in which waiting is required for the cooling to create the next coating layer or in which work can also possibly be performed at the same temperature, there results an extremely rapid production of a coating having multiple coating layers.

The at least one coating layer of essentially aluminum, titanium and nitrogen is deposited by means of a CVD method. If additional coating layers are provided, these are advantageously also deposited by means of a CVD method.

The other object of the invention is attained by a coating of the type named at the outset, wherein the lamellae of varying chemical composition are each formed with a cubic structure, wherein with the retention of the cubic structure, aluminum and titanium can be partially replaced by other metals, and nitrogen can be replaced by oxygen and/or carbon.

A coating according to the invention is in particular characterized in that said coating, because of the formation with lamellae of varying chemical composition but an identical crystal system within the different lamellae, which themselves are a component of the coating layer, produces excellent properties. Particularly in the formation of the lamellae with a respectively cubic structure, there results for the coating layer with the lamellae a high hardness with concurrent oxidation resistance.

The lamellae are preferably formed with the lamellar periodicity of less than 20 nm, preferably 3 nm to 17 nm, in particular 5 nm to 15 nm. A lamellar periodicity can thereby be adjusted during production by a modification of the introduced content of a titanium precursor with a fixed content of an aluminum precursor. In particular, the range from 5 nm to 15 nm for the lamellar periodicity, preferably approximately 8 nm to 13 nm, has proven especially advantageous for a high hardness. A thickness of the sequence of two lamellae of varying chemical composition is considered the lamellar periodicity, as can be seen in a transmission electron microscope.

The at least one coating layer of essentially aluminum, titanium and nitrogen can be formed with an average composition of $Al_xTi_{1-x}N$ with $0.70 \leq x \leq 0.90$, preferably $0.75 \leq x \leq 0.85$, in order to obtain an optimum of high hardness with concurrently high oxidation resistance.

The at least one coating layer of essentially aluminum, titanium and nitrogen can have a thickness of 1 μm to 20 μm, in particular 3 μm to 8 μm.

If a suitable substrate such as sapphire is provided, epitaxial growth is possible in the at least one coating layer of essentially aluminum, titanium and nitrogen.

To fine-tune a coating profile for various different cutting applications, it can be expedient that the coating has a multi-layer structure. A bonding layer as a first coating layer can be expedient if the cutting insert is a hard metal, but also in other cases. For hard metals, it has in this regard proven advantageous to provide a first coating layer of preferably TiN with a thickness of less than 1.0 μm. On this first coating layer or bonding layer, multiple additional coating layers can then be deposited. For the coating layer of essentially aluminum, titanium and nitrogen, it has thereby proven expedient that said layer is deposited on a coating layer of TiCN, typically MT-TiCN. It is thereby possible that the coating layer of TiCN is directly deposited on the coating layer of TiN. However, it is also possible that multiple additional layers are deposited therebetween. It is also possible that multiple coating layers of essentially aluminum, titanium and nitrogen are deposited in an alternating manner with other coating layers, and/or that an ter coating layer finishing the coating, for example of TiN, $Al_2O_3$ or diamond, is provided.

According to the illustrated advantages, a cutting tool such as a cutting plate can comprise a coating according to the invention.

Figure 5:
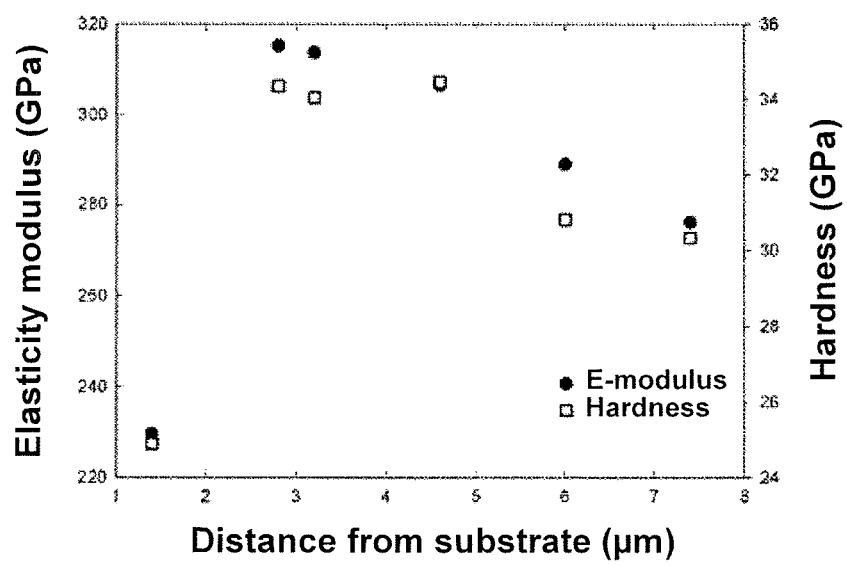

Additional features, advantages and effects of the invention follow from the exemplary embodiments described below. The drawings which are thereby referenced show the following:

FIG. 1 A basic structure of a coating on an object;

FIG. 2 An image taken using a transmission electron microscope (TEM);

FIG. 3 A diffraction pattern for the image according to FIG. 2;

FIG. 4 An X-ray diffractogram;

FIG. 5 A chart for the hardness and elasticity modulus

Figure 6:
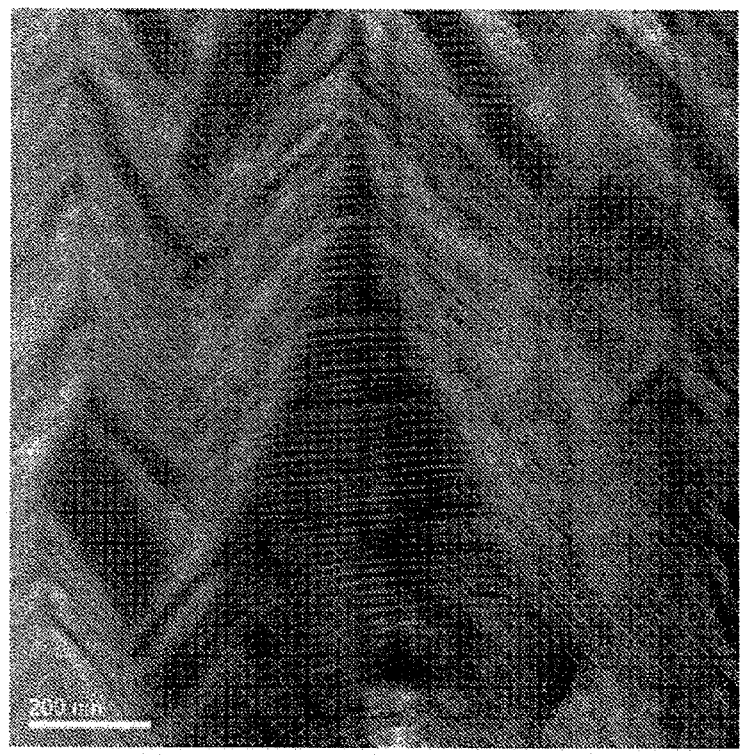
Figure 7:
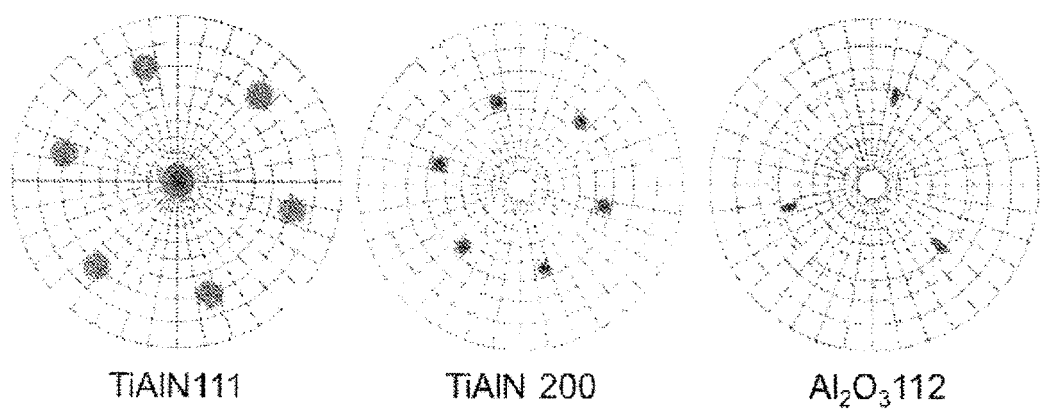

FIG. 6 A TEM image;

FIG. 7 An illustration of pole figures.

In FIG. 1, an object 1 according to the invention is illustrated schematically. The object 1 is typically formed from a sintered hard metal which is composed of carbides and/or carbonitrides of tungsten, titanium, niobium or other metals and a binder metal selected from the group comprising cobalt, nickel and/or iron. A binder metal content is thereby normally up to 10 wt. %. Typically, the object 1 is composed of up to 10 wt. % cobalt and/or other binder metals, the remainder being tungsten carbide and up to 5 wt. % other carbides and/or carbonitrides of other metals.

A coating layer 3 of TiN serving as a bonding layer is deposited on the object 1. The coating layer 3 normally has a thickness of less than 2 μm, preferably 0.4 to 1.2 μm. On the coating layer 3, a coating layer 4 of TiCN serving as an intermediate layer is deposited. This coating layer 4 is an MT-TiCN coating layer. A coating layer 4 of this type normally has a columnar structure with spiky crystals, which are essentially aligned parallel to the surface normals on the object 1. Finally, an additional coating layer 5 is deposited on the coating layer 4. The coating layer 5 is formed essentially from aluminum, titanium and nitrogen and deposited by means of a CVD method. Depending on the process management or the gases used, smaller contents of chlorine and oxygen can also be present in the coating layer 5. The other coating layers 3, 4 can also be deposited using a CVD method.

The object 1 can in particular be a cutting insert such as an indexed cutting plate. To coat said cutting plate, or to create a coating 2, the bonding layer or coating layer 3 of TiN is deposited in a first step at a process temperature from 880° C. to 900° C. from a gas containing or composed of nitrogen, hydrogen and titanium tetrachloride. The temperature is then lowered, and at a temperature from e.g. 820° C. to 840° C., a coating layer 4 formed from MT-TiCN is deposited with a thickness of 2 μm to 5 μm. The deposition thereby takes place from a gas composed of nitrogen, hydrogen, acetonitrile and titanium tetrachloride. The corresponding process temperature and the use of acetonitrile as a carbon or nitrogen source ensures a formation of the intermediate layer with columnar growth or spiky crystals of TiCN. The TiCN coating layer thereby comprises in cross-section longitudinally extended crystals, which preferably run parallel, but at least mostly at an angle of ±30°, to a surface normal of the object 1. With a corresponding TiCN coating layer, there results a suitable bonding of the subsequently deposited coating layer 5 with an average composition of $Al_xTi_{1-x}N$. In this regard, it is expedient that the TiCN coating layer has an average composition of $TiC_aN_{1-a}$, with a in the range from 0.3 to 0.8, in particular 0.4 to 0.6.

On the intermediate layer of TiN, in which the titanium can be replaced by aluminum at up to 40 mol % in order to increase a hardness, the coating layer 5 with aluminum, titanium and nitrogen is finally applied, for which the temperature is lowered to approximately 800° C. to 830° C. The coating layer 5, which is, but does not have to be, an outermost coating layer, is created from a gas containing aluminum trichloride, nitrogen, hydrogen, titanium chloride and a separately introduced mixture of ammonia and nitrogen. Thus, in a second step for producing the intermediate layer and in a third step for producing the coating layer 5, a process temperature for each is lowered, which is extremely cost-efficient and allows a rapid creation of the coating 2 on the cutting insert. The coating layer 5 is preferably deposited at a pressure of 20 mbar to 80 mbar, in particular 25 mbar to 55 mbar, wherein the pressure is regulated via the volume flow rate of the introduced gases.

In Tables 1 and 2 below, typical process parameters and compositions are provided.

TABLE 1

Process parameters for coating with AlTiN CVD coating layer having alternating cubic lamellae

| Coating layer | Temperature [° C.] | Gas composition in [L/min], $TiCl_4$ and $CH_3CN$ for MT-TiCN in [mL/min] |
|---|---|---|
| TiN | 880-900 | $TiCl_4$/2.2, $N_2$/14, $H_2$/17 |
| MT-TiCN | 750-850 | $CH_3CN$/0.5, $TiCl_4$/2.5, $N_2$/12, $H_2$/4 |
| AlTiN | 750-850 | HCl—$AlCl_3$/3.3 to 1.1, $TiCl_4$/1.2, $NH_3$—$N_2$/0.9 to 4.5, $H_2$/61 |

TABLE 2

Properties of the AlTiN coating layer

| Coating layer | Layer thickness [μm] general | Layer thickness [μm] preferred | Composition |
|---|---|---|---|
| AlTiN | 1-20 | 3-8 | $Al_xTi_{1-x}N$, x = 0.75-0.85 |

In FIG. 2, a TEM image of a coating structure is shown, in which structure an AlTiN gradient layer is applied to a hard metal, which layer was applied essentially as described above, although the content of the titanium precursor was steadily increased and that of the aluminum precursor was kept constant. The gradient layer starts at $Al_{90}Ti_{10}N$ and ends at $Al_{70}Ti_{30}N$. In the range therebetween, the structure known from WO 2013/134796 A1 with alternating lamellae of a hexagonal and cubical structure initially forms while contents of the titanium precursor are still low. At higher contents, a structure then forms in which only cubic phases are still present, which follows from FIG. 3. Thus, by varying a ratio of the precursors, the structure can be set in a targeted manner on the nanometer scale. The lamellar periodicity is approximately 9 nm.

In FIG. 4, an X-ray diffractogram for a coating layer 5 can be seen, from which it follows in an evaluation that a coating layer 5 is formed with a cubic structure and hexagonal phases are not detectable, which confirms the results from FIG. 3 for the gradient layer.

Surprisingly, a coating layer 5 exhibits not only a high hardness, but also a suitable toughness. As the measurement results shown in FIG. 5 for the gradient layer according to FIG. 2 indicate, the gradient layer reaches a maximum for both hardness and toughness in the range of the exclusively cubic formation.

In FIG. 6, a high-resolution TEM image of a coating layer 5 is shown, which layer was produced as described above. In this image, the formed lamellae which have a lamellar periodicity of a few nanometers can be seen. Lamellae with a composition of $Al_xTi_{1-x}N$ having a higher Al content than Ti content and a cubic structure alternate consecutively with lamellae $Ti_{1-x}Al_xN$ lamellae having a higher Ti content than Al content and also a cubic structure. It is assumed that this special nanostructure causes the excellent properties of the coating layer 5, in particular the high hardness and strength. The coating layer 5 is not only embodied as particularly oxidation-stable and having high hardness and strength, but also as very thermally stable. Continuous thermal loads at 950° C. to 1050° C. for one hour showed that cracks occur in hard metal substrates starting at 1000° C., whereas a coating layer 5, aside from the concurrent breakaway with hard metal parts, withstands the thermal loading.

If a coating layer 5 is deposited on a suitable substrate such as sapphire, epitaxial growth can also occur, which can be derived from the pole figures in FIG. 7, which are based on a coating layer 5 directly deposited on sapphire.

Even though a coating layer 5, possibly also together with additional coating layers 3, 4, is preferably used for cutting inserts such as indexed cutting plates, any other desired cutting tools that are exposed to high temperatures and mechanical stresses during use and must thereby also exhibit a high oxidation resistance can of course also be coated.

The invention claimed is:

1. A method for coating an object, comprising applying a coating having one or more coating layers to the object,
   wherein at least one coating layer is formed essentially from aluminum, titanium and nitrogen,
   wherein the at least one coating layer comprises, at least in some regions, mutually adjoining lamellae of varying chemical composition and is deposited with an average composition of $Al_xTi_{(1-x)}N$ with 0.70≤x≤0.90, and at a pressure of 10 mbar to 80 mbar from a gas phase having at least one aluminum precursor and at least one titanium precursor,
   wherein the molar ratio of aluminum to titanium is adjusted so that the lamellae of varying chemical composition are each formed with a cubic structure, wherein lamellae with a composition of $Al_xTi_{(1-x)}N$ having a higher Al content than Ti content and a cubic structure alternate consecutively with lamellae with a composition of $Ti_{(1-x)}Al_xN$ having a higher Ti content than Al content and also a cubic structure, and wherein with the preservation of the cubic structure, aluminum and titanium can be partially replaced by other metals, and nitrogen can be partially replaced by oxygen and/or carbon.

2. The method according to claim 1, wherein for the deposition of the at least one coating layer of essentially aluminum, titanium and nitrogen, a molar Al/Ti ratio in the gas phase is, at least temporarily, limited to maximally 3.0.

3. The method according to claim 1, wherein the lamellae are deposited with a lamellar periodicity of less than 20 nm.

4. The method according to claim 1, wherein the at least one coating layer of essentially aluminum, titanium and nitrogen is deposited from a gas phase containing aluminum trichloride, titanium tetrachloride and ammonia.

5. The method according to claim 4, wherein the at least one coating layer of essentially aluminum, titanium and nitrogen is deposited with an average composition of $Al_xTi_{(1-x)}N$ with $0.75 \leq x \leq 0.85$.

6. The method according to claim 1, wherein the at least one coating layer of essentially aluminum, titanium and nitrogen is deposited at a pressure of 20 mbar to 50 mbar.

7. The method according to claim 1, wherein the at least one coating layer of essentially aluminum, titanium and nitrogen is deposited at a temperature of approximately 750° C. to 850° C.

8. The method according to claim 1, wherein the at least one coating layer of essentially aluminum, titanium and nitrogen is deposited with a thickness of 1 μm to 20 μm.

9. The method according to claim 1, wherein the at least one coating layer of essentially aluminum, titanium and nitrogen is deposited epitaxially.

10. The method according to claim 1, wherein an object made of a hard metal is coated.

11. The method according to claim 1, wherein a multi-layer coating is deposited on the object, wherein as a first coating layer a bonding layer of TiN is deposited.

12. The method according to claim 11, wherein in the deposition of a first coating layer and subsequent deposition of each additional coating layer, a deposition temperature is respectively lowered or maintained.

13. The method according to claim 1, wherein the at least one coating layer of essentially aluminum, titanium and nitrogen is deposited on a coating layer of TiCN.

14. The method according to claim 1, wherein the at least one coating layer of essentially aluminum, titanium and nitrogen is deposited by means of a CVD method.

15. The method according to claim 1, wherein with the preservation of the cubic structure, aluminum and titanium are partially replaced by other metals comprising silicon and/or chromium in an amount up to 20% by weight.

16. The method according to claim 1, wherein with the preservation of the cubic structure, nitrogen is partially replaced by oxygen and/or carbon.

17. The method according to claim 1, wherein the molar Al/Ti ratio in the gas phase is, at least temporarily, limited to maximally 2.0, the lamellae are deposited with a lamellar periodicity of 3 nm to 17 nm, and the at least one coating layer of essentially aluminum, titanium and nitrogen is deposited with a thickness of 3 μm to 8 μm.

18. A coating which is applied to an object by a CVD method, wherein the coating comprises one or more coating layers and wherein at least one coating layer is formed essentially from aluminum, titanium and nitrogen with an average composition of $Al_xTi_{(1-x)}N$ with $0.70 \leq x \leq 0.90$ and, at least in some regions, comprises mutually adjoining lamellae of varying chemical composition, the lamellae of varying chemical composition are each formed with a cubic structure, wherein lamellae with a composition of $Al_xTi_{(1-x)}N$ having a higher Al content than Ti content and a cubic structure alternate consecutively with lamellae with a composition of $Ti_{(1-x)}Al_xN$ having a higher Ti content than Al content and also a cubic structure, and wherein with the preservation of the cubic structure, aluminum and titanium can be partially replaced by other metals, and nitrogen can be partially replaced by oxygen and/or carbon.

19. The coating according to claim 18, wherein the lamellae are formed with a lamellar periodicity of less than 20 nm.

20. The coating according to claim 18, wherein the at least one coating layer of essentially aluminum, titanium and nitrogen has an average composition of $Al_xTi_{(1-x)}N$ with $0.75 \leq x \leq 0.85$.

21. The coating according to claim 18, wherein the at least one coating layer of essentially aluminum, titanium and nitrogen has a thickness of 1 μm to 20 μm.

22. The coating according to claim 18, wherein the at least one coating layer of essentially aluminum, titanium and nitrogen is grown epitaxially.

23. The coating according to claim 18, wherein the coating has a multi-layer structure.

24. The coating according to claim 23, wherein a first coating layer is provided as a bonding layer on the object, wherein the first coating layer is formed from TiN with a thickness of less than 1.0 μm.

25. The coating according to claim 23, wherein the at least one coating layer of essentially aluminum, titanium and nitrogen is deposited on a coating layer of TiCN.

26. An object comprising a cutting tool having a coating according to claim 18.

27. The coating according to claim 18 wherein with the preservation of the cubic structure, aluminum and titanium are partially replaced by other metals comprising silicon and/or chromium in an amount up to 20% by weight.

28. The coating according to claim 18, wherein with the preservation of the cubic structure, nitrogen is partially replaced by oxygen and/or carbon.

29. The coating according to claim 18, wherein the lamellae are deposited with a lamellar periodicity of 3 nm to 17 nm, and the at least one coating layer of essentially aluminum, titanium and nitrogen is deposited with a thickness of 3 μm to 8 μm.

* * * * *